United States Patent
Isomoto et al.

(10) Patent No.: US 12,374,532 B2
(45) Date of Patent: Jul. 29, 2025

(54) PLASMA PROCESSING METHOD

(71) Applicant: HITACHI HIGH-TECH CORPORATION, Tokyo (JP)

(72) Inventors: Mai Isomoto, Tokyo (JP); Hitoshi Kobayashi, Tokyo (JP); Ryota Takahashi, Tokyo (JP); Satoshi Une, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 18/279,299

(22) PCT Filed: Apr. 11, 2022

(86) PCT No.: PCT/JP2022/017466
§ 371 (c)(1),
(2) Date: Aug. 29, 2023

(87) PCT Pub. No.: WO2023/199371
PCT Pub. Date: Oct. 19, 2023

(65) Prior Publication Data
US 2025/0079136 A1    Mar. 6, 2025

(51) Int. Cl.
*H01J 37/32*    (2006.01)

(52) U.S. Cl.
CPC .. *H01J 37/32697* (2013.01); *H01J 37/32293* (2013.01); *H01J 37/32715* (2013.01); *H01J 2237/3341* (2013.01)

(58) Field of Classification Search
CPC .......... H01J 37/32697; H01J 37/32293; H01J 37/32715; H01J 2237/3341
See application file for complete search history.

(56) References Cited

U.S. PATENT DOCUMENTS 6,171,763 B1    1/2001  Wang et al.
6,194,323 B1    2/2001  Downey et al.
(Continued)

FOREIGN PATENT DOCUMENTS

JP    2000-311899 A    11/2000
JP    2001-085395 A    3/2001
(Continued)

OTHER PUBLICATIONS

Search Report mailed Jul. 5, 2022 in International Application No. PCT/JP2022/017466.
(Continued)

*Primary Examiner* — Adam D Houston
(74) *Attorney, Agent, or Firm* — Miles & Stockbridge, P.C.

(57) ABSTRACT

An object of the invention is to provide a plasma processing method for preventing generation of deposition from an underlying metal film and attaining an anisotropic shape in hard mask etching. The plasma processing method for forming a mask using a film to be etched whose underlying layer is a metal film according to the invention includes: a first step of etching, using a plasma generated by mixed gas containing $O_2$ gas, $CHF_3$ gas, $NF_3$ gas, Ar gas, and He gas, while supplying pulse-modulated radio frequency power to a sample stage on which a sample having the film to be etched is placed; and a second step of etching while supplying continuous wave (CW) radio frequency power to the sample stage after the first step. The film to be etched is a TEOS film and a silicon nitride film, and the continuous wave (CW) radio frequency power is smaller than a product of the pulse-modulated radio frequency power and a pulse-modulated duty ratio and is smaller than 50 W.

7 Claims, 10 Drawing Sheets

(56) References Cited

U.S. PATENT DOCUMENTS

| | | | |
|---|---|---|---|
| 7,351,665 B2 * | 4/2008 | Ogasawara | H01L 21/31116 438/743 |
| 10,128,085 B2 * | 11/2018 | Wada | H01L 21/3065 |
| 2006/0213616 A1 * | 9/2006 | Ogasawara | H01L 21/31116 257/E21.252 |
| 2007/0167002 A1 * | 7/2007 | Lee | H01L 21/76814 438/637 |
| 2008/0081477 A1 * | 4/2008 | Ikeda | H01L 21/31116 257/E21.252 |
| 2012/0238102 A1 | 9/2012 | Zhang et al. | |
| 2016/0133530 A1 * | 5/2016 | Sonoda | H01J 37/32192 118/704 |
| 2016/0181118 A1 * | 6/2016 | Kudou | H01J 37/321 438/718 |
| 2016/0203958 A1 * | 7/2016 | Arase | H01L 21/6833 438/10 |
| 2016/0240353 A1 * | 8/2016 | Nagami | H01J 37/32577 |
| 2016/0351406 A1 * | 12/2016 | Sawataishi | H01J 37/00 |
| 2017/0148610 A1 * | 5/2017 | Wada | H01J 37/32009 |
| 2018/0233376 A9 * | 8/2018 | Ma | H01L 21/31116 |
| 2020/0294770 A1 * | 9/2020 | Kubota | H01J 37/32091 |
| 2020/0357650 A1 * | 11/2020 | Takamatsu | H01L 21/3065 |
| 2021/0404055 A1 * | 12/2021 | Zhao | C23C 14/0021 |
| 2022/0122810 A1 * | 4/2022 | Kubota | H01J 37/32091 |
| 2025/0079136 A1 * | 3/2025 | Isomoto | H01L 21/3065 |

FOREIGN PATENT DOCUMENTS

| | | | | |
|---|---|---|---|---|
| JP | 2014-508424 A | | 4/2014 | |
| JP | 2014135512 A | * | 7/2014 | H01J 37/32091 |
| JP | 2015-211139 A | | 11/2015 | |
| KR | 20210084419 A | * | 7/2021 | |
| TW | 1812575 B | * | 8/2023 | |
| WO | WO-2023026317 A1 | * | 3/2023 | H01J 37/32091 |
| WO | WO-2024241390 A1 | * | 11/2024 | H01J 37/32174 |

OTHER PUBLICATIONS

Written Opinion mailed Jul. 5, 2022 in International Application No. PCT/JP2022/017466.

* cited by examiner

PLASMA PROCESSING METHOD

TECHNICAL FIELD

The present invention relates to a plasma processing method suitable for performing a surface treatment on a semiconductor substrate or the like using a plasma.

BACKGROUND ART

In the related art, in a hard mask etching technique for a semiconductor device having a stacked structure, a method of performing a main etching step (hereinafter, also referred to as a "first step") on each layer and then performing an over etching step (hereinafter, also referred to as a "second step") having high selectivity for a mask layer and an underlying layer is adopted. In particular, in the main etching step of etching hard SiN, an etchant is diluted with Ar gas to obtain an anisotropic shape. In the over etching step, a reaction is prevented by low-flow-rate gas, and the anisotropic shape is obtained using a high bias having a strong ion-assisting property.

PTL 1 discloses a method for selectively etching silicon nitride from a substrate having a stacked structure including a silicon nitride layer and a silicon oxide layer. The method includes: applying energy to fluorine-containing gas and generating a plasma; filtering the plasma to provide reactive gas having a fluorine radical concentration higher than a fluorine ion concentration; and etching the silicon nitride layer at an etching rate higher than that of etching the silicon oxide layer by exposing the reactive gas to the substrate in a gas reaction region of a substrate processing chamber.

CITATION LIST

Patent Literature

PTL 1: JP2014-508424A

SUMMARY OF INVENTION

Technical Problem

In recent years, with miniaturization of devices, various metal films in metal interconnects have been developed.

Due to the variety of metal films, a phenomenon is confirmed in which, depending on a film type, a metal is bonded to ions and deposition is generated. The metal is knocked out by the ions strongly colliding with an underlying metal film during over etching by a high bias having a strong ion-assisting property. Since a problem arises that etching is inhibited when the deposition generated in this manner adheres to and is deposited on a side wall of a pattern, a new etching technique for preventing the deposition is required.

PTL 1 discloses a method for selectively etching the silicon nitride layer, but does not disclose a specific etching method for preventing the generation of deposition from an underlying metal film and obtaining an anisotropic shape.

Therefore, an object of the invention is to provide a plasma processing method capable of preventing generation of deposition from an underlying metal film and attaining an anisotropic shape in hard mask etching.

Solution to Problem

In order to solve the above problem, one of representative etching methods according to the invention is a plasma processing method for forming a mask using a film to be etched whose underlying layer is a metal film. The plasma processing method includes: a first step of etching, using a plasma generated by mixed containing gas oxygen ($O_2$) gas, trifluoromethane ($CHF_3$) gas, nitrogen trifluoride ($NF_3$) gas, argon (Ar) gas, and helium (He) gas, the film to be etched while supplying pulse-modulated radio frequency power to a sample stage on which a sample having the film to be etched is placed; and a second step of etching the etched film to be etched while supplying continuous wave (CW) radio frequency power to the sample stage after the first step. The film to be etched is a tetra ethyl ortho silicate (TEOS) film and a silicon nitride film, and the continuous wave (CW) radio frequency power is smaller than a product of the pulse-modulated radio frequency power and a pulse-modulated duty ratio and is smaller than 50 W.

Based on a combination of the first step (main etching step) and the second step (over etching step) as described above, the problem can be solved according to the invention.

Advantageous Effects of Invention

According to the invention, in the hard mask etching, generation of deposition from the underlying metal film can be prevented and an anisotropic shape can be attained. Further, it is also possible to etch a hard mask in which selectivity and critical dimension (CD) controllability are improved.

Problems, configurations, and effects other than those described above will be clarified with the description of an embodiment as follows.

DESCRIPTION OF EMBODIMENTS

Hereinafter, an embodiment according to the invention will be described with reference to the drawings. The invention is not limited to this embodiment. In the description of the drawings, the same parts are denoted by the same reference signs.

<Etching Processing Apparatus>

Figure 1:
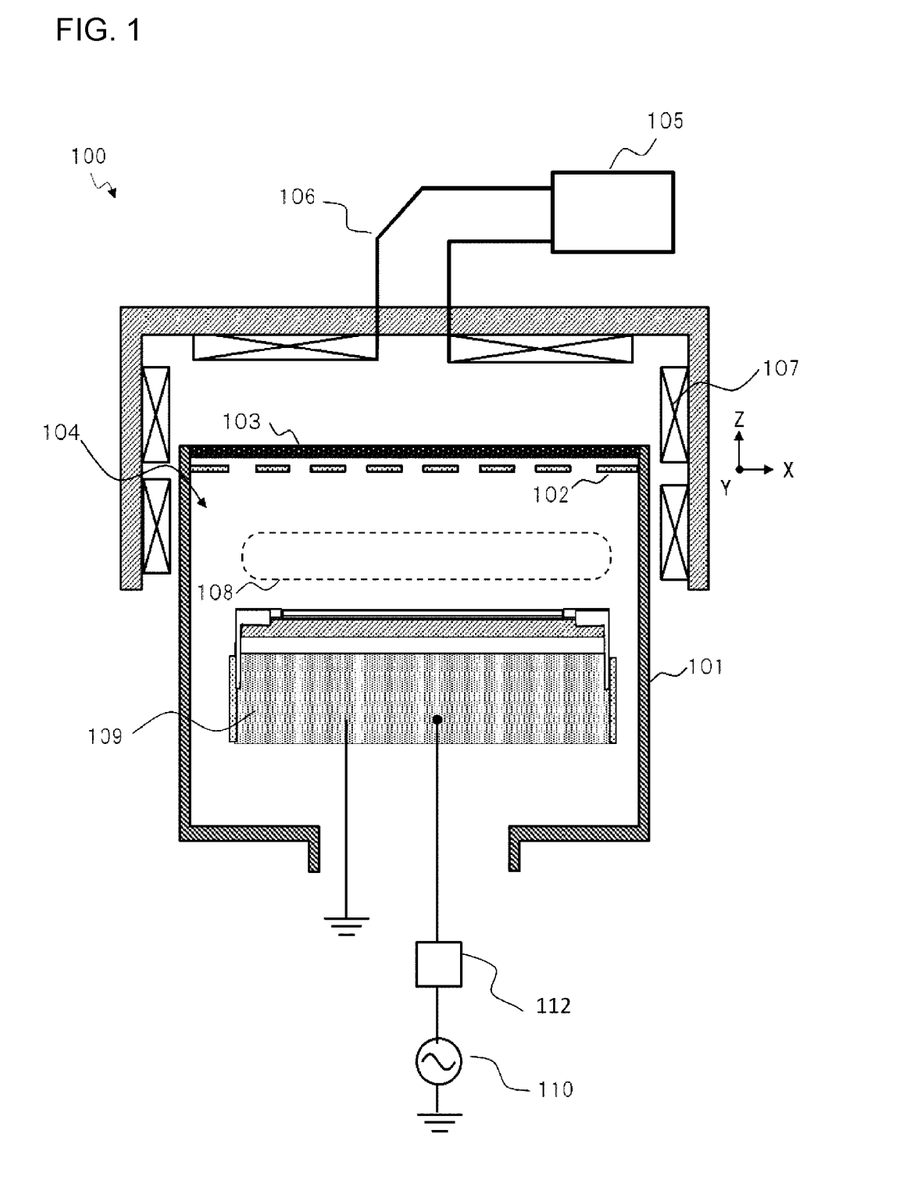
FIG. 1 is a longitudinal cross-sectional view showing an etching processing apparatus of a microwave ECR plasma type used in the present embodiment.

FIG. 1 is a longitudinal cross-sectional view showing an etching processing apparatus 100 of a microwave ECR plasma type used in the present embodiment. An electron cyclotron resonance is generated by an interaction between a microwave having a specific frequency and an electron that performs a periodic orbital motion in a magnetic field, and a high-density plasma is intensively formed with energy of the electron cyclotron resonance. A dry etching system is provided in which ions having directivity, rather than radicals having no directivity, are mainly used as etching species for etching.

A vacuum container in the etching processing apparatus 100 shown in FIG. 1 includes an etching chamber 101 having a cylindrical shape and having a processing chamber 104, a system that provides an electric field and a magnetic field for forming an ECR plasma above the etching chamber 101, and a vacuum pump and a pressure control valve for exhausting lower gas.

The etching chamber 101 includes a dielectric window 103 for supplying the microwave from above to the processing chamber 104, and a shower plate 102 having a plurality of through holes for introducing the gas into the processing chamber 104. Etching gas enters from a gas introduction port (not shown) between the dielectric window 103 and the shower plate 102, and is introduced into the processing chamber 104 via the through holes of the shower plate 102. Since the gas or generated plasma particles are exhausted outward by a vacuum exhausting unit such as a turbo molecular pump, a vacuum exhausting port is disposed at a bottom portion of the processing chamber 104.

A waveguide 106 through which the microwave necessary for generating the plasma propagates inside and a source power supply 105 are connected above the dielectric window 103. The microwave generated by the source power supply 105 propagates through the waveguide 106, resonates in a cylindrical space above the dielectric window 103, and is transmitted through the dielectric window 103 and supplied to the processing chamber 104. In order to generate the magnetic field, solenoid coils 107 having a cylindrical shape surround an outer periphery of a cylindrical side wall above the etching chamber 101, and a portion above the dielectric window 103.

Processing gas supplied to the processing chamber 104 is excited and a plasma 108 is generated by the interaction between the microwave generated by the source power supply 105 and the electron that performs a periodic orbital motion in the magnetic field generated by the solenoid coils 107.

A film structure of a wafer placed on a sample stage 109 is etched using the plasma 108. Therefore, a radio frequency power supply 110 and a matching device 112 are disposed on the sample stage 109 substantially concentrically disposed below the processing chamber 104. Radio frequency power is supplied from the radio frequency power supply 110 to the sample stage 109 via the matching device 112, and a potential difference is formed between the plasma 108 and the sample stage 109. Accordingly, charged particles such as ions inside the plasma 108 are attracted, and etching processing is performed on the film structure.

<Processing Flow>

Figure 2:
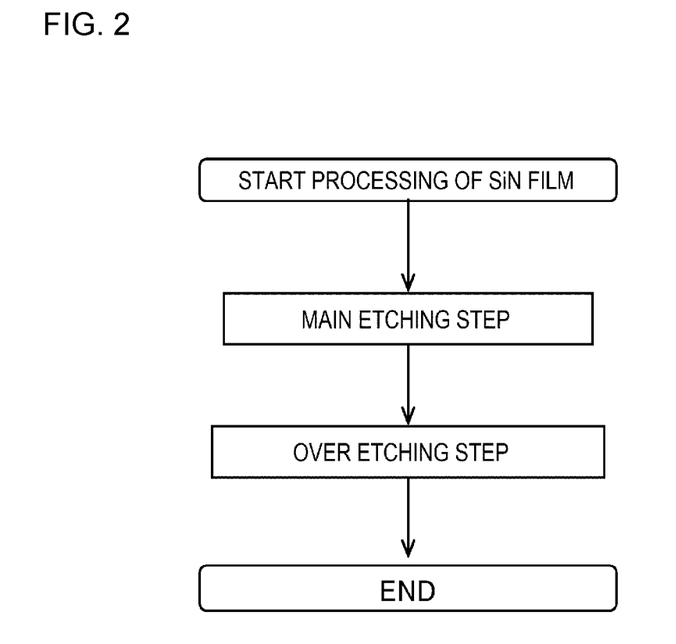
FIG. 2 is a flowchart showing an etching process of a film to be etched.

A plasma processing method according to the present embodiment performed using the etching processing apparatus 100 in FIG. 1 will be described. FIG. 2 is a flowchart showing an etching process of a film to be etched. When processing of a SiN film serving as the film to be etched is started, dry etching is performed in an order of a main etching and an over etching step. Generally, the main etching step is intended to attain an anisotropic shape in a normal direction of a substrate surface, and the over etching step is used for forming a concave shape formed by further etching in a lateral direction and for selectivity and CD control.

<Stacked Structure>

Figure 3A:
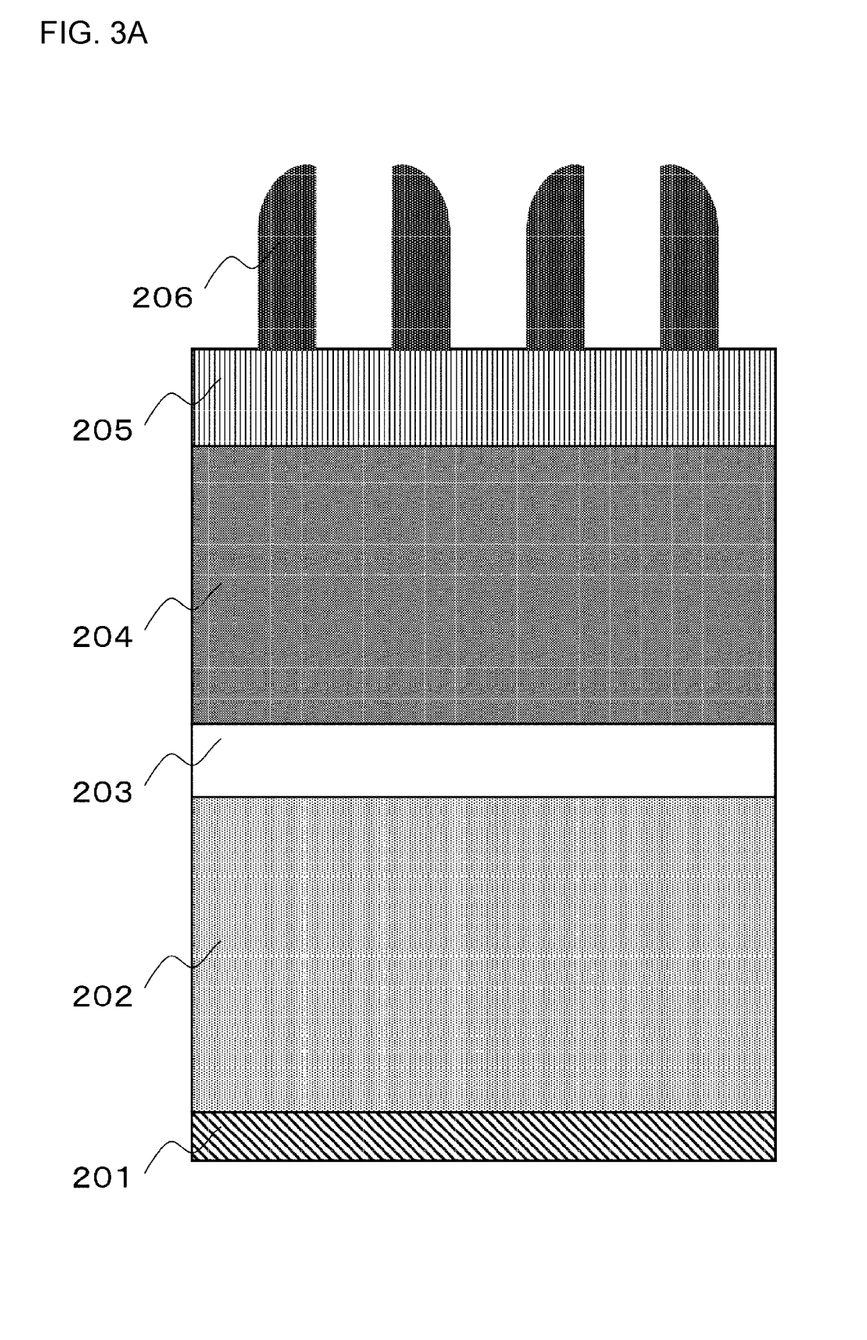
FIG. 3A is a schematic view showing a cross-sectional structure of a semiconductor wafer to which a plasma processing method is applied according to the present embodiment.

FIG. 3A is a schematic view showing a cross-sectional structure of a semiconductor wafer to which the plasma processing method is applied according to the present embodiment. A metal film 201, a silicon nitride (SiN) film 202, a tetra ethyl ortho silicate (TEOS) film 203, an amorphous carbon layer (ACL) film 204, a silicon oxynitride (SiON) film 205, and a silicon oxide ($SiO_2$) film 206 are stacked in this order from a bottom to form a stacked structure. However, it is needless to say that the number of layers in the stacked structure or a material of each layer is not limited thereto.

Figure 3B:
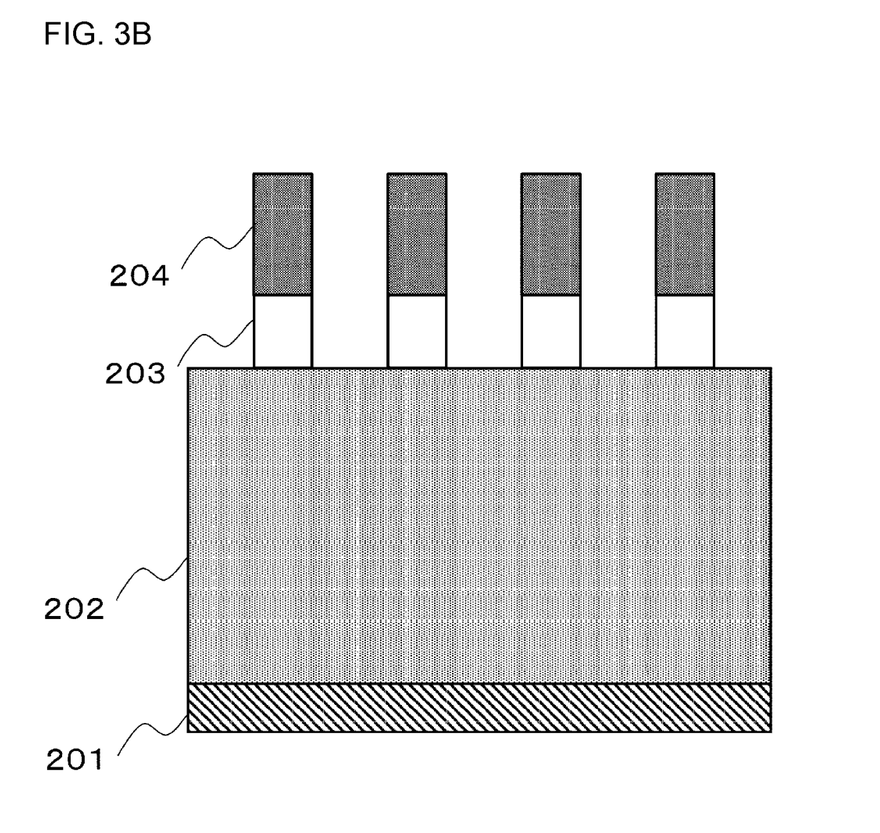
FIG. 3B is a schematic view showing a target stacked structure of main etching according to the present embodiment.

The ACL film 204, the SiON film 205, and the $SiO_2$ film 206 that are formed at an upper portion of the stacked structure transfer a device pattern in advance by appropriate processing. Next, a target stacked structure in the dry etching is created in which the ACL film 204 serves as a hard mask and the SiN film 202 and the TEOS film 203 serve as films to be etched. FIG. 3B is a schematic view showing the target stacked structure in the main etching according to the present embodiment.

The dry etching including the main etching step and the over etching step is performed using the metal film 201 as an underlying layer, the ACL film 204 as the hard mask, and the TEOS film 203 and the SiN film 202 as the films to be etched.

The films to be etched including the SiN film 202 and the TEOS film 203 have a thickness of about 160 nm, in which the SiN film 202 has a thickness of about 130 nm. However, a thickness ratio between the SiN film 202 and the TEOS film 203 is not fixed.

[Main Etching]

Figure 4A:
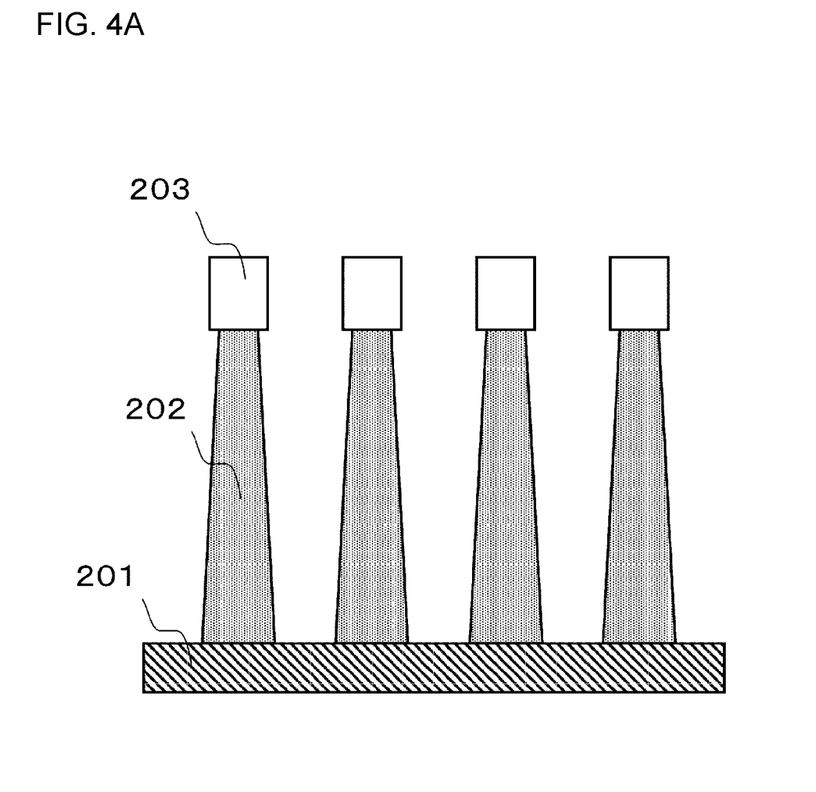
FIG. 4A is a schematic view showing a pattern shape formed by main etching in the related art.

When the main etching step is performed on a hard SiN film, gas dilution based on argon (Ar) is applied to an etchant in the related art. FIG. 4A is a schematic view showing a pattern shape formed by the main etching in the related art. Hereinafter, a pattern is formed by etching the SiN film 202 and the TEOS film 203 as the films to be etched in the main etching step, and a shape of the pattern is referred to as a pattern shape. As shown in FIG. 4A, when the main etching is performed using mixed gas in the related art, a pattern having a tapered shape tends to be formed. In order to prevent generation of deposition and obtain an anisotropic shape under an over etching condition, it is necessary to perform processing to attain a shape having anisotropy higher than that in the related art at a time point of the main etching.

Therefore, in the main etching according to the present embodiment, mixed gas containing oxygen ($O_2$), trifluoromethane ($CHF_3$), nitrogen trifluoride ($NF_3$), Ar, and He is used with a characteristic that He is added at a flow rate higher than a flow rate of Ar in order to attain a shape having high anisotropy. For example, it is conceivable to adjust the flow rate of He to 300 L/min while the flow rate of Ar is 70 L/min.

Figure 5A:
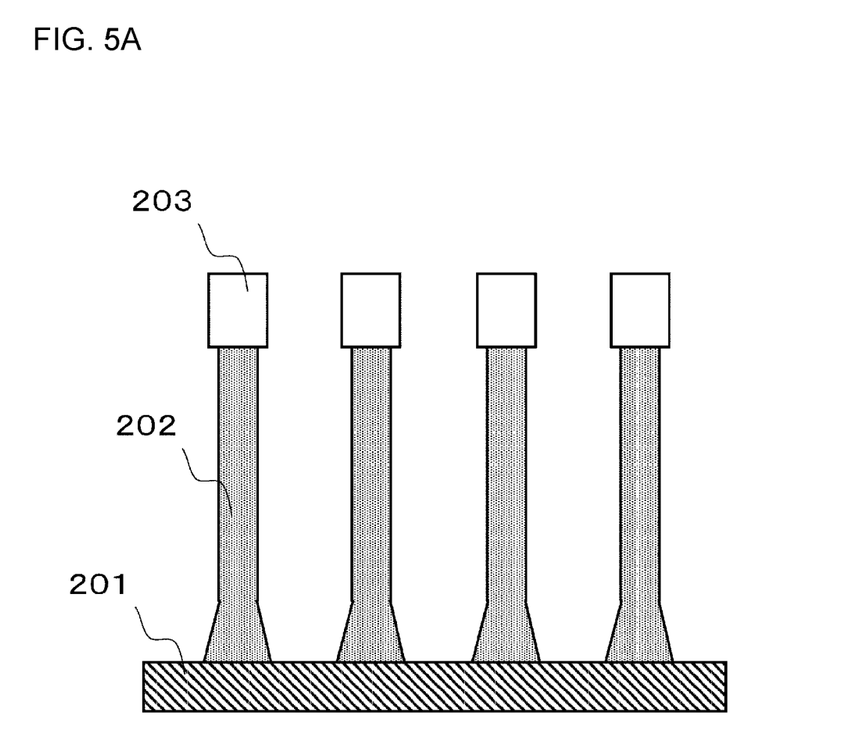
FIG. 5A is a schematic view showing a pattern shape formed by the main etching according to the present embodiment.

Then, the main etching is performed using a pulse-modulated mode for a wafer bias. Specifically, optimization is appropriately performed according to the embodiment, and for example, a pulse-modulated mode with a duty ratio (a ratio at an ON time) of 50% at 1,000 Hz is used. FIG. 5A is a schematic view showing a pattern shape formed by the main etching according to the present embodiment.

Operation and Effect

In order to attain a shape having high anisotropy, an etching rate in a vertical direction may be higher than that in a horizontal direction, and the etching rate can be controlled by adding dilution gas used as a buffer.

That is, when a flow rate of the mixed gas used for etching is increased by the addition of the dilution gas, a decrease in plasma density is prevented, ion scattering hardly occurs, and the number of ions that are obliquely incident decreases. Accordingly, it is possible to perform etching with a higher rate and improved anisotropy and to stabilize plasma discharge.

However, if the addition amount of Ar is increased in order to increase the flow rate of the mixed gas, the amount of etchant decreases, and a more tapered shape is formed. In contrast, helium (He) has a large diffusion effect and the plasma can be spread while colliding with other etching gas, and etching with high anisotropy can be promoted. Therefore, the flow rate of He may be higher than that of Ar.

By using the pulse-modulated mode for the wafer bias, it is possible to attain an effect of promoting etching with anisotropy downward by repeating processing in which the etching proceeds at a pulse-on time and formation of a protective film on a side wall of a pattern proceeds at a pulse-off time.

[Over Etching]

In an over etching step in the related art, a reaction is prevented by low-flow-rate gas, the wafer bias is a high bias which accounts for 90% or more used in the main etching step, and an anisotropic shape is attained by performing etching in the pulse-modulated mode.

Figure 4B:
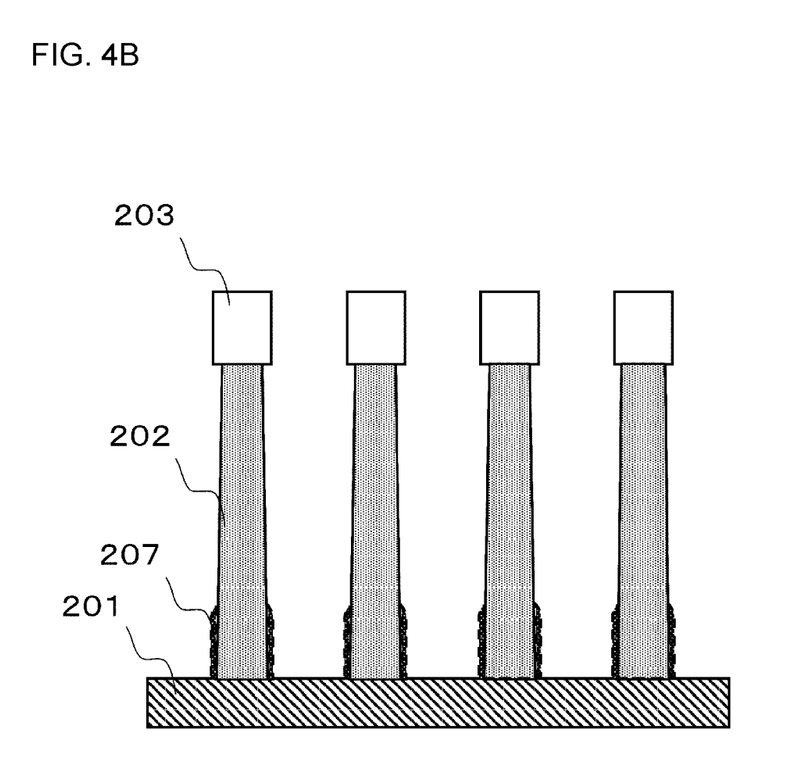
FIG. 4B is a schematic view showing a pattern in which deposition is deposited in over etching in the related art.

However, due to variety of metal films in recent years as described above, a high bias is used as the wafer bias depending on a film type, and thus problems arise that ions are bonded to a metal knocked out from a metal film, and deposition 207 is generated and adheres to the side wall of the pattern. FIG. 4B is a schematic view showing a pattern in which the deposition 207 is deposited in the over etching in the related art. Depositing of the deposition 207 normally progresses from the vicinity of the underlying metal film.

Figure 4C:
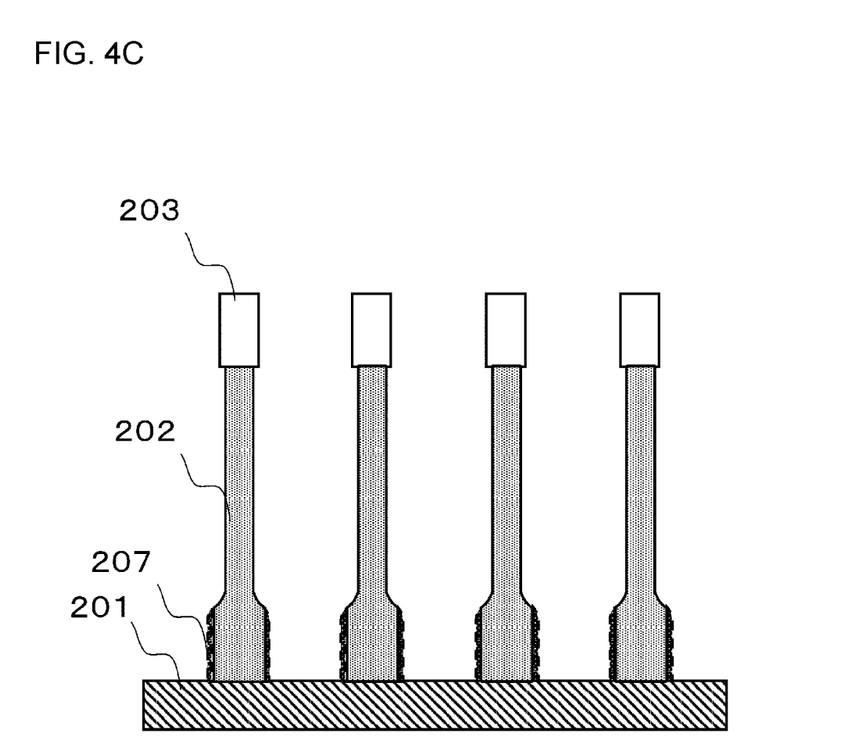
FIG. 4C is a schematic view showing a pattern shape formed by inhibiting etching of a deposited portion of the deposition in the over etching in the related art.

When the deposition 207 adheres and is deposited, the etching does not progress, and an anisotropic shape cannot be attained by subsequent processing. FIG. 4C is a schematic view showing a pattern shape formed by inhibiting the etching of a deposited portion of the deposition in the over etching in the related art. Therefore, in order to perform the over etching such that the side wall of the pattern has a plane at an angle close to being perpendicular to the metal film 201, it is important to prevent the amount of the deposition 207 that adheres to the side wall of the pattern.

As a method for preventing the deposition 207 from being deposited, it is conceivable to decrease a pressure in a reaction container and increase a flow rate of gas introduced into the reaction container. However, the pressure and the flow rate of the gas are often limited to appropriate ranges in order to attain desirable etching characteristics, and limits of the pressure and the flow rate are determined by an exhausting capacity. Therefore, it is difficult to prevent the deposition 207 from being deposited by the pressure, the flow rate, and the like.

Therefore, in the over etching step according to the present embodiment, mixed gas in which fluorine gas sulfur hexafluoride ($SF_6$) and $CHF_3$ serving as etchants are increased as compared to known gas is used. Thus, radio frequency power for generating plasma in the over etching can be set to be larger than radio frequency power for generating plasma in the main etching. Further, the radio frequency power for generating the plasma in the main etching and the radio frequency power for generating the plasma in the over etching may be set as radio frequency power of the microwave, and a current for forming a magnetic field in the over etching may be set larger than a current for forming a magnetic field in the main etching.

A continuous wave (CW) mode is used for the wafer bias in the over etching according to the present embodiment, and continuous wave (CW) radio frequency power is smaller than a product (hereinafter, sometimes referred to as "effective power") of pulse-modulated radio frequency power of the wafer bias in the main etching step and a pulse-modulated duty ratio and is smaller than 50 W. Preferably, the continuous wave (CW) radio frequency power can be set to 10% or less of the effective power. However, the CW mode may be adopted as necessary.

Figure 5B:
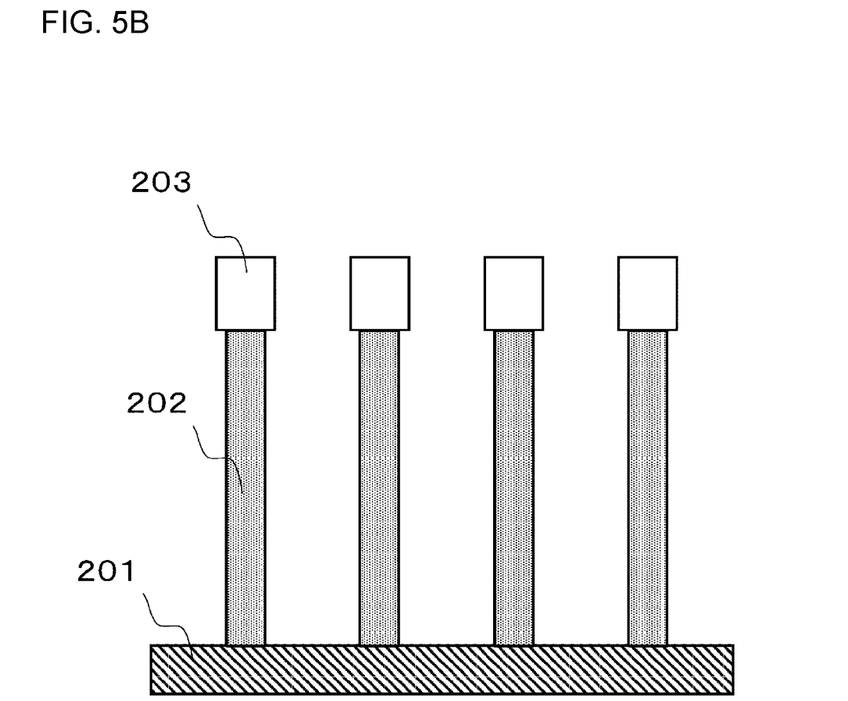
FIG. 5B is a schematic view showing a pattern in which deposition is prevented from being deposited by over etching according to the present embodiment.
Figure 5C:
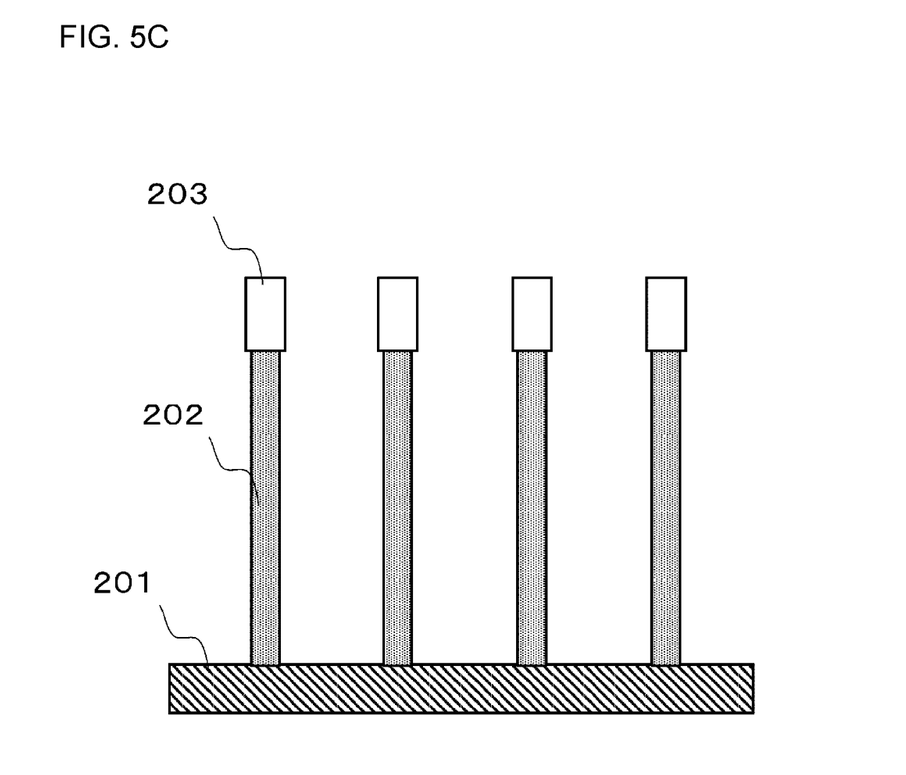
FIG. 5C is a schematic view showing a pattern having an anisotropic shape finally obtained by the over etching according to the present embodiment.

FIG. 5B is a schematic view showing a pattern in which the deposition is prevented from being deposited by the over etching according to the present embodiment. FIG. 5C is a schematic view showing a pattern having an anisotropic shape finally obtained by the over etching according to the present embodiment.

Operation and Effect

By setting the wafer bias as a low bias, ion-assisting property is weakened, an impact of ions on the metal film is prevented, and the generation of the metal that causes the deposition is prevented. Meanwhile, by selecting gas species having a large amount of fluorine gas and further appropriately combining continuous voltage application using the CW mode, an isotropic etching effect is improved, so that a progress of the over etching can be controlled in a balanced manner.

In the present embodiment, by adopting the plasma processing method in which the main etching step of attaining the anisotropic shape in advance and the over etching step of preventing the generation of the deposition are combined as described above, it is possible to perform etching for forming the anisotropic shape in which the generation of the deposition is prevented, and CD controllability is also improved. In addition, it is possible to implement the over etching with high selectivity for the SiN film and the metal film using a combination of the low bias and fluorine.

Although the invention made by the inventors has been described based on the embodiment, the invention is not limited to the embodiment, and various modifications can be made without departing from the gist of the invention.

For example, in the above-described embodiment, a plasma processing apparatus including a microwave ECR plasma source is described as an example, but the same effect as in the present embodiment can be attained even in a plasma processing apparatus using another plasma generation method such as a capacitively coupled plasma source or an inductively coupled plasma source.

REFERENCE SIGNS LIST

100: etching processing apparatus
101: etching chamber
102: shower plate
103: dielectric window 104: processing chamber
105: source power supply
106: waveguide
107: solenoid coil
108: plasma
109: sample stage
110: radio frequency power supply
112: matching device
201: metal film
202: SiN film
203: TEOS film
204: ACL film
205: SiON film
205: $SiO_2$ film
207: deposition

The invention claimed is:

1. A plasma processing method for forming a mask using a film to be etched whose underlying layer is a metal film, the plasma processing method comprising:
a first step of etching, using a plasma generated by mixed gas containing oxygen ($O_2$) gas, trifluoromethane ($CHF_3$) gas, nitrogen trifluoride ($NF_3$) gas, argon (Ar) gas, and helium (He) gas, the film to be etched while supplying pulse-modulated radio frequency power to a sample stage on which a sample having the film to be etched is placed; and
a second step of etching the etched film to be etched while supplying continuous wave (CW) radio frequency power to the sample stage after the first step, wherein
the film to be etched is a tetra ethyl ortho silicate (TEOS) film and a silicon nitride film, and
the continuous wave (CW) radio frequency power is smaller than a product of the pulse-modulated radio frequency power and a pulse-modulated duty ratio and is smaller than 50 W.

2. The plasma processing method according to claim 1, wherein
a flow rate of the helium (He) gas is higher than a flow rate of the argon (Ar) gas.

3. The plasma processing method according to claim 1, wherein
as etching gas in the second step, mixed gas containing sulfur hexafluoride ($SF_6$) gas and the trifluoromethane ($CHF_3$) gas is used.

4. The plasma processing method according to claim 1, wherein
the continuous wave (CW) radio frequency power is 10% or less of the product of the pulse-modulated radio frequency power and the pulse-modulated duty ratio.

5. The plasma processing method according to claim 1, wherein
radio frequency power for generating a plasma in the second step is larger than radio frequency power for generating a plasma in the first step.

6. The plasma processing method according to claim 5, wherein
the radio frequency power for generating the plasma in the first step and the radio frequency power for generating the plasma in the second step is radio frequency power of a microwave, and
a current for forming a magnetic field in the second step is larger than a current for forming a magnetic field in the first step.

7. The plasma processing method according to claim 1, wherein
the mask for etching the film to be etched is an amorphous carbon layer (ACL) film.

* * * * *